(12) United States Patent
Zhu et al.

(10) Patent No.: US 12,245,442 B2
(45) Date of Patent: Mar. 4, 2025

(54) SEMICONDUCTOR DEVICE, METHOD OF MANUFACTURING THE SAME AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Guilei Wang, Beijing (CN); Henry H. Radamson, Beijing (CN); Yanbo Zhang, Beijing (CN); Zhengyong Zhu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 339 days.

(21) Appl. No.: 16/337,882

(22) PCT Filed: Jul. 31, 2017

(86) PCT No.: PCT/CN2017/095178
§ 371 (c)(1),
(2) Date: Mar. 28, 2019

(87) PCT Pub. No.: WO2018/059109
PCT Pub. Date: Apr. 5, 2018

(65) Prior Publication Data
US 2020/0027950 A1    Jan. 23, 2020

(30) Foreign Application Priority Data

Sep. 30, 2016 (CN) .......................... 201610872541.2
Jun. 30, 2017 (CN) .......................... 201710530250.X

(51) Int. Cl.
*H01L 21/02* (2006.01)
*B82Y 10/00* (2011.01)
(Continued)

(52) U.S. Cl.
CPC ............ *H10D 84/038* (2025.01); *B82Y 10/00* (2013.01); *G05B 23/0216* (2013.01);
(Continued)

(58) Field of Classification Search
CPC ........... H01L 29/66666; H01L 29/7827; H01L 29/42392; H01L 29/78642; H01L 21/02636
See application file for complete search history.

(56) References Cited

U.S. PATENT DOCUMENTS 6,943,407 B2    9/2005   Ouyang et al.
9,196,730 B1    11/2015  Yu et al.
(Continued)

FOREIGN PATENT DOCUMENTS

CN    1901225 A    1/2007
CN    1906769 A    1/2007
(Continued)

OTHER PUBLICATIONS https://en.wikipedia.org/wiki/Diamond_cubic (Year: 2021).*
(Continued)

*Primary Examiner* — Eric K Ashbahian
(74) *Attorney, Agent, or Firm* — Christensen, Fonder, Dardi & Herbert PLLC; John P. Fonder

(57) ABSTRACT

A semiconductor device including a substrate, a first source/drain layer, a channel layer and a second source/drain layer stacked on the substrate in sequence, and a gate stack surrounding a periphery of the channel layer. The channel
(Continued)

layer includes a semiconductor material causing an increased ON current and/or a reduced OFF current as compared to Si.

30 Claims, 8 Drawing Sheets

(51) Int. Cl.
*G05B 23/02* (2006.01)
*G06T 19/00* (2011.01)
*H01L 21/223* (2006.01)
*H01L 21/225* (2006.01)
*H01L 21/3065* (2006.01)
*H01L 21/308* (2006.01)
*H01L 21/324* (2006.01)
*H01L 23/522* (2006.01)
*H04N 7/18* (2006.01)
*H04N 23/698* (2023.01)
*H10D 30/01* (2025.01)
*H10D 30/43* (2025.01)
*H10D 30/47* (2025.01)
*H10D 30/63* (2025.01)
*H10D 30/66* (2025.01)
*H10D 30/67* (2025.01)
*H10D 30/69* (2025.01)
*H10D 62/10* (2025.01)
*H10D 62/13* (2025.01)
*H10D 62/17* (2025.01)
*H10D 62/40* (2025.01)
*H10D 62/815* (2025.01)
*H10D 62/82* (2025.01)
*H10D 62/822* (2025.01)
*H10D 62/824* (2025.01)
*H10D 64/01* (2025.01)
*H10D 64/23* (2025.01)
*H10D 64/27* (2025.01)
*H10D 64/62* (2025.01)
*H10D 84/01* (2025.01)
*H10D 84/03* (2025.01)
*H10D 84/85* (2025.01)
*H10D 88/00* (2025.01)
*G06F 3/04817* (2022.01)
*G06F 3/0482* (2013.01)
*G06V 20/40* (2022.01)
*H01L 21/3105* (2006.01)
*H04N 13/111* (2018.01)
*H04N 13/332* (2018.01)
*H04N 13/366* (2018.01)
*H04N 13/398* (2018.01)
*H04N 23/90* (2023.01)

(52) U.S. Cl.
CPC ...... *G06T 19/006* (2013.01); *H01L 21/02532* (2013.01); *H01L 21/02636* (2013.01); *H01L 21/2236* (2013.01); *H01L 21/2252* (2013.01); *H01L 21/2253* (2013.01); *H01L 21/2258* (2013.01); *H01L 21/3065* (2013.01); *H01L 21/3083* (2013.01); *H01L 21/324* (2013.01); *H01L 23/5221* (2013.01); *H04N 7/181* (2013.01); *H04N 23/698* (2023.01); *H10D 30/014* (2025.01); *H10D 30/015* (2025.01); *H10D 30/021* (2025.01); *H10D 30/025* (2025.01); *H10D 30/0291* (2025.01); *H10D 30/031* (2025.01); *H10D 30/43* (2025.01); *H10D 30/477* (2025.01); *H10D 30/63* (2025.01); *H10D 30/668* (2025.01); *H10D 30/6713* (2025.01); *H10D 30/6728* (2025.01); *H10D 30/6735* (2025.01); *H10D 30/6757* (2025.01); *H10D 30/751* (2025.01); *H10D 30/797* (2025.01); *H10D 62/112* (2025.01); *H10D 62/116* (2025.01); *H10D 62/122* (2025.01); *H10D 62/151* (2025.01); *H10D 62/292* (2025.01); *H10D 62/371* (2025.01); *H10D 62/393* (2025.01); *H10D 62/40* (2025.01); *H10D 62/8162* (2025.01); *H10D 62/82* (2025.01); *H10D 62/822* (2025.01); *H10D 62/824* (2025.01); *H10D 64/017* (2025.01); *H10D 64/021* (2025.01); *H10D 64/252* (2025.01); *H10D 64/518* (2025.01); *H10D 64/62* (2025.01); *H10D 84/0128* (2025.01); *H10D 84/013* (2025.01); *H10D 84/014* (2025.01); *H10D 84/0149* (2025.01); *H10D 84/016* (2025.01); *H10D 84/0167* (2025.01); *H10D 84/017* (2025.01); *H10D 84/0177* (2025.01); *H10D 84/0184* (2025.01); *H10D 84/0186* (2025.01); *H10D 84/0188* (2025.01); *H10D 84/0195* (2025.01); *H10D 84/85* (2025.01); *H10D 84/857* (2025.01); *H10D 88/01* (2025.01); *G05B 2219/32014* (2013.01); *G06F 3/04817* (2013.01); *G06F 3/0482* (2013.01); *G06V 20/40* (2022.01); *G06V 20/44* (2022.01); *G06V 2201/06* (2022.01); *H01L 21/31053* (2013.01); *H04N 13/111* (2018.05); *H04N 13/332* (2018.05); *H04N 13/366* (2018.05); *H04N 13/398* (2018.05); *H04N 23/90* (2023.01); *H10D 62/115* (2025.01); *H10D 84/0172* (2025.01)

(56) References Cited

U.S. PATENT DOCUMENTS

| | | |
|---|---|---|
| 9,251,888 B1 | 2/2016 | Liaw |
| 9,685,537 B1* | 6/2017 | Xie .................. H01L 29/66787 |
| 9,786,758 B1* | 10/2017 | Balakrishnan ...... H01L 29/7839 |
| 2002/0076884 A1 | 6/2002 | Weis |
| 2003/0116792 A1 | 6/2003 | Chen et al. |
| 2004/0157353 A1 | 8/2004 | Ouyang et al. |
| 2006/0226495 A1 | 10/2006 | Kwon |
| 2006/0255330 A1 | 11/2006 | Chen et al. |
| 2008/0067607 A1* | 3/2008 | Verhulst .............. H01L 29/0665 257/E29.313 |
| 2009/0200604 A1 | 8/2009 | Chidambarrao et al. |
| 2010/0327319 A1* | 12/2010 | Iacopi ................. H01L 29/7391 257/192 |
| 2013/0082333 A1 | 4/2013 | Chen et al. |
| 2015/0017767 A1 | 1/2015 | Masuoka et al. |
| 2015/0200288 A1* | 7/2015 | Zhang ................. H01L 29/7376 257/12 |
| 2015/0249143 A1 | 9/2015 | Sano et al. |
| 2015/0380555 A1 | 12/2015 | Ohtou et al. |
| 2016/0049397 A1 | 2/2016 | Chang et al. |
| 2016/0064541 A1* | 3/2016 | Diaz .................... H01L 27/092 257/329 |
| 2016/0211368 A1* | 7/2016 | Chen ................. H01L 29/66666 |
| 2016/0268256 A1* | 9/2016 | Yang ............... H01L 21/823418 |
| 2016/0293739 A1* | 10/2016 | Zhang ................ H01L 27/0814 |
| 2016/0315084 A1 | 10/2016 | Wu et al. |
| 2016/0372316 A1 | 12/2016 | Yang et al. |
| 2017/0077231 A1 | 3/2017 | Balakrishnan et al. |
| 2017/0170196 A1* | 6/2017 | Anderson ........... H01L 27/1211 |
| 2017/0194318 A1 | 7/2017 | Balakrishnan et al. |
| 2017/0338334 A1 | 11/2017 | Cheng et al. |
| 2017/0345927 A1* | 11/2017 | Cantoro ............. H01L 29/7827 |
| 2018/0047832 A1* | 2/2018 | Tapily ................. H01L 29/7833 |
| 2018/0254322 A1 | 9/2018 | Cheng et al. |

(56) References Cited

U.S. PATENT DOCUMENTS

| | | |
|---|---|---|
| 2018/0277676 A1 | 9/2018 | Basker et al. |
| 2019/0172928 A1 | 6/2019 | Gluschenkov et al. |

FOREIGN PATENT DOCUMENTS

| | | |
|---|---|---|
| CN | 102299154 A | 12/2011 |
| CN | 103337519 A | 10/2013 |
| CN | 104022121 A | 9/2014 |
| CN | 104103515 A | 10/2014 |
| CN | 105280705 A | 1/2016 |
| CN | 106298778 A | 1/2017 |
| CN | 107706094 A | 2/2018 |

OTHER PUBLICATIONS https://en.wikipedia.org/wiki/Germanium-tin (Year: 2021).*
https://www.sensorsinc.com/technology/what-is-ingaas (Year: 2021).*
U.S. Patent Office Action dated Jan. 29, 2021 for U.S. Appl. No. 16/338,169 (23 pages).
U.S. Patent Office Action dated Aug. 26, 2020 for U.S. Appl. No. 16/337,878 (16 pages).
U.S. Patent Office Action dated Jun. 11, 2020 for U.S. Appl. No. 16/338,169 (39 pages).
U.S. Patent Office Action dated Jun. 23, 2020 for U.S. Appl. No. 15/720,240 (14 pages).
U.S. Patent Office Action dated Dec. 27, 2018 for U.S. Appl. No. 15/720,913 (10 pages).
U.S. Patent Office Action dated Feb. 22, 2021 for U.S. Appl. No. 16/337,878 (11 pages).
International Search Report for PCT/CN2017/095124 (2 pages).
Written Opinion of the International Searching Authority (Translation) for PCT/CN2017/095124 (4 pages).
International Search Report for PCT/CN2017/095130 (2 pages).
Written Opinion of the International Sea4rching Authority (Translation) for PCT/CN2017/095130 (4 pages).

* cited by examiner

SEMICONDUCTOR DEVICE, METHOD OF MANUFACTURING THE SAME AND ELECTRONIC DEVICE INCLUDING THE SAME

CROSS-REFERENCE TO RELATED APPLICATIONS

This application is a U.S. national phase application of PCT Application No. PCT/CN2017/095178, filed on Jul. 31, 2017, entitled "SEMICONDUCTOR DEVICE, MANUFACTURING METHOD THEREOF, AND ELECTRONIC APPARATUS COMPRISING SAME," which claims priority to Chinese Patent Application No. 201610872541.2, filed on Sep. 30, 2016, entitled "SEMICONDUCTOR DEVICE, METHOD OF MANUFACTURING THE SAME, AND ELECTRONIC DEVICE INCLUDING THE SAME," and Chinese Patent Application No. 201710530250.X, filed on Jun. 30, 2017, entitled "SEMICONDUCTOR DEVICE, METHOD OF MANUFACTURING THE SAME, AND ELECTRONIC DEVICE INCLUDING THE SAME," which are incorporated herein by reference in their entireties.

TECHNICAL FIELD

The present disclosure relates generally to the semiconductor field, and more particularly, to a vertical semiconductor device having an increased ON current and/or a reduced OFF current, a method of manufacturing the same, and an electronic device including the same.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

SUMMARY

In view of the above, the present disclosure aims to provide, among others, a vertical semiconductor device having an increased ON current and/or a reduced OFF current, a method of manufacturing the same, and an electronic device including the same.

According to an aspect of the present disclosure, there is provided a semiconductor device, comprising: a substrate; a first source/drain layer, a channel layer and a second source/drain layer stacked on the substrate in sequence, wherein the channel layer comprises a semiconductor material causing an increased ON current and/or a reduced OFF current as compared with Si; and a gate stack surrounding a periphery of the channel layer.

According to another aspect of the present disclosure, there is provided a method of manufacturing a semiconductor device, comprising: epitaxially growing a first source/drain layer on a substrate; epitaxially growing a channel layer on the first source/drain layer, wherein the channel layer has an increased ON current and/or a reduced OFF current as compared to Si; epitaxially growing a second source/drain layer on the channel layer; defining an active region for the semiconductor device in the first source/drain layer, the channel layer and the second source/drain layer; and forming a gate stack surrounding a periphery of the channel layer.

According to a still further aspect of the present disclosure, there is provided an electronic device comprising an Integrated Circuit (IC) comprising the above described semiconductor device.

According to embodiments of the present disclosure, the channel layer may comprise a semiconductor material having an increased ON current and/or a reduced OFF current as compared to the Si material. For example, for a p-type device, the channel layer may comprise a semiconductor material which facilitates increasing the ON current and/or reducing the OFF current, for example, a group IV or III-V semiconductor material such as Ge, SiGe, SiGeSn, GeSn, InSb, or InGaSb. Alternatively, for an n-type device, the channel layer may comprise a semiconductor material which facilitates increasing the ON current and/or reducing the OFF current, for example, a group IV or III-V compound semiconductor material such as SiGe, Ge, GaAs, InGaAs, InP, AlGaAs, InAlAs, InAs, InGa, InAlGa, GaN, InSb, or InGaSb.

Further, the gate stack is formed to surround the periphery of the channel layer and the channel is formed in the channel layer. Thus, a gate length is determined substantially by a thickness of the channel layer. The channel layer may be formed by, for example, epitaxy, so that its thickness can be well controlled. Therefore, the gate length can be well controlled. The periphery of the channel layer may be recessed inwards with respect to that of the first source/drain layer and the second source/drain layer, so that the gate stack can be embedded into the recess, to reduce or even avoid overlap with the source/drain regions and thus contribute to reduced parasitic capacitance between the gate and the source/drain. Further, the channel layer may comprise a monocrystalline semiconductor material, resulting in a high ON current and/or low OFF current and thus enhanced device performances.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like or similar reference numerals denote like or similar elements.

DETAILED DESCRIPTION

Figure 1:
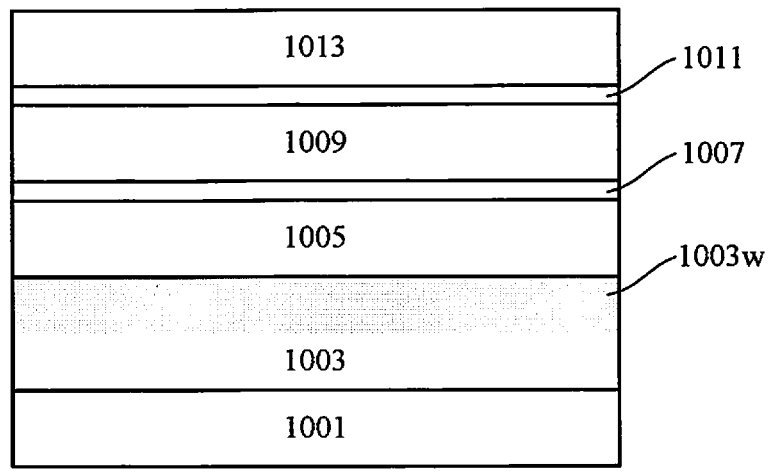
FIGS. 1-10(b) are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A vertical semiconductor device according to embodiments of the present disclosure may comprise a first source/drain layer, a channel layer and a second source/drain layer stacked on a substrate in sequence. Source/drain regions of the device may be formed in the first source/drain layer and the second source/drain layer, while a channel region of the device may be formed in the channel layer. The channel layer may comprise a semiconductor material which increases an ON current and/or reduces an OFF current as compared to the Si material. For example, for an n-type device, the channel layer may use a semiconductor material which facilitates improving mobility of electrons, for example, a group IV or III-V compound semiconductor such as SiGe, Ge, GaAs, InGaAs, InP, AlGaAs, InAlAs, InAs, InGa, InAlGa, InSb, InGaSb or GaN; or alternatively, for a p-type device, the channel layer may use a semiconductor material which facilitates improving mobility of holes, for example, a group IV or III-V semiconductor material such as Ge, SiGe, SiGeSn, InSb, InGaSb or GeSn.

According to embodiments of the present disclosure, the semiconductor device may be a conventional Field Effect Transistor (FET). In the case of the FET, the first source/drain layer and the second source/drain layer (or the source and drain regions on opposite sides of the channel layer) may have the same conductivity type of doping (for example, n-type doping or p-type doping). A conduction channel may be formed by the channel region between the source and drain regions at the opposite ends of the channel region. Alternatively, such a semiconductor device may be a tunneling FET. In the case of the tunneling FET, the first source/drain layer and the second source/drain layer (or the source and drain regions on opposite sides of the channel layer) may have different conductivity types of doping (for example, n-type doping and p-type doping respectively). In this case, charged particles such as electrons may tunnel from the source region into the drain region through the channel region, thereby forming a conduction path between the source and drain regions. Although the conventional FET and the tunneling FET have different conduction mechanisms, they both exhibit such an electrical property that the gate controls whether there is a conduction or not between the source and drain regions. Therefore, for both the conventional FET and the tunneling FET, descriptions are made by collectively using the terms "source/drain layer (source/drain region)" and "channel layer (channel region)", although there is no common "channel" in the tunneling FET.

A gate stack may be formed to surround a periphery of the channel layer. As a result, a gate length may be determined by a thickness of the channel layer itself, rather than depending on etching timing as in the conventional art. The channel layer may be formed by, for example, epitaxy, so that its thickness can be well controlled. Therefore, the gate length can be well controlled. The channel layer may have its periphery recessed with respect to that of the first source/drain layer and the second source/drain layer. In this way, the formed gate stack may be embedded into a recess of the channel layer with respect to the first source/drain layer and the second source/drain layer, thereby reducing or even avoiding overlap with the source/drain regions, and facilitating reducing parasitic capacitance between the gate and the source/drain.

The channel layer may be made of a monocrystalline semiconductor material to improve device performances. Certainly, the first source/drain layer and the second source/drain layer may also be made of a monocrystalline semiconductor material. In this case, the monocrystalline semiconductor material of the channel layer and the monocrystalline semiconductor material of the source/drain layers may be eutectic. Mobility of electrons or holes in the monocrystalline semiconductor material of the channel layer may be greater than that in the first source/drain layer and the second source/drain layer. Further, a forbidden band gap of the first source/drain layer and the second source/drain layer may be greater than that of the monocrystalline semiconductor material of the channel layer.

According to embodiments of the present disclosure, the monocrystalline semiconductor material of the channel layer may have the same crystal structure as that of the first source/drain layer and the second source/drain layer. In this case, a lattice constant of the first source/drain layer and the second source/drain layer without being strained may be greater than that of the monocrystalline semiconductor material of the channel layer without being strained. Then, the mobility of carriers in the monocrystalline semiconductor material of the channel layer may be greater than that if without being strained, or an effective mass of light carriers in the monocrystalline semiconductor material of the channel layer may be less than that if without being strained, or a concentration of light carriers in the monocrystalline semiconductor material of the channel layer may be greater than that if without being strained. Alternatively, the lattice constant of the first source/drain layer and the second source/drain layer without being strained may be less than the lattice constant of the monocrystalline semiconductor material of the channel layer without being strained. Then, the mobility of electrons in the monocrystalline semiconductor material of the channel layer may be greater than that if without being strained, or an effective mass of electrons in the monocrystalline semiconductor material of the channel layer may be less than that if without being strained.

According to embodiments of the present disclosure, a leakage suppression layer or an ON current enhancement layer may be further disposed between the first source/drain layer and the channel layer and/or between the channel layer and the second source/drain layer (particularly between two layers constituting a tunneling junction in the case of the tunneling FET). The leakage suppression layer may have a band gap greater than that of at least one of overlying or underlying layers contiguous thereto. The ON current enhancement layer may have a band gap less than that of at least one of overlying or underlying layers contiguous thereto. Due to such differences between the band gaps, it is possible to suppress leakage or enhance the ON current.

According to embodiments of the present disclosure, doping of the source/drain regions may move partially into end portions of the channel layer close to the first source/drain layer and the second source/drain layer, or into the leakage suppression layer or the ON current enhancement layer (if any). As a result, there may be a doping distribution in the end portions of the channel layer close to the first source/drain layer and the second source/drain layer or in the leakage suppression layer, which helps reducing resistance between the source/drain region and the channel region when the device is ON and thus improving the device performances.

According to embodiments of the present disclosure, the first source/drain layer and the second source/drain layer may comprise a semiconductor material different from that of the channel layer (but may still belong to the same material system, for example, for an n-type device, the source/drain layers and the channel layer may comprise different group III-V compound semiconductor materials or group IV semiconductor materials; or alternatively for a p-type device, the source/drain layers and the channel layer may comprise different group IV semiconductor materials or group III-V compound semiconductor materials). Thus, it facilitates processing of the channel layer by, for example, selective etching, to recess the channel layer with respect to the first source/drain layer and the second source/drain layer, and/or optimization of ON current. Further, the first source/drain layer and the second source/drain layer may comprise the same semiconductor material as each other.

The respective semiconductor layers may be epitaxial layers on the substrate. For example, the first source/drain layer may be a semiconductor layer epitaxially grown on the substrate, the channel layer may be a semiconductor layer epitaxially grown on the first source/drain layer, and the second source/drain layer may be a semiconductor layer epitaxially grown on the channel layer.

Such a semiconductor device may be manufactured as follows. Specifically, a first source/drain layer may be epitaxially grown on a substrate. Next, a channel layer may be epitaxially grown on the first source/drain layer. A semiconductor material which is not Si and increases an ON current and/or reduces an OFF current as compared to the Si material may be used in growing the channel layer. A second source/drain layer may be epitaxially grown on the channel layer. The channel layer may have its thickness well controlled in the epitaxy process. Since the respective layers are epitaxially grown separately, there may be a clear crystalline interface between at least one pair of adjacent ones of those layers. Further, the respective layers may be doped separately, and then there may be a doping concentration interface between at least one pair of adjacent ones of those layers.

A leakage suppression layer and/or an ON current enhancement layer may be further epitaxially grown between the first source/drain layer and the channel layer and/or between the channel layer and the second source/drain layer, to suppress leakage and/or enhance the ON current.

For the first source/drain layer, the channel layer and the second source/drain layer (and the leakage suppression layer or the ON current enhancement layer, if any) which are stacked, an active region may be defined therein. For example, those layers may be selectively etched in sequence into a desired shape. Generally, the active region may have a pillar shape (for example, a cylindrical shape). The etching of the first source/drain layer may be performed with respect to only an upper portion of first source/drain layer, so that a lower portion of the first source/drain layer may extend beyond a periphery of the upper portion, for convenience of connection to the source/drain region formed in the first source/drain layer in subsequent processes. Then, a gate stack may be formed to surround a periphery of the channel layer Further, the periphery of the channel layer may be recessed with respect to that of the first source/drain layer and the second source/drain layer, to define a space to accommodate the gate stack. For example, this can be done by selective etching. In this case, the gate stack may be embedded into the recess.

Source/drain regions may be formed in the first source/drain layer and the second source/drain layer. For example, this can be done by doping the first source/drain layer and the second source/drain layer. For example, ion implantation, plasma doping, or the like may be performed, or in-situ doping may be performed during the growing of the first source/drain layer and the second source/drain layer. The doping of the first source/drain layer and the second source/drain layer may move into layers contiguous thereto.

The technology of the present disclosure can be implemented in various ways, some of which are exemplified in the following with reference to the drawings.

FIGS. 1-10(b) are schematic views showing a flow of manufacturing a semiconductor device according to an embodiment of the present disclosure.

As shown in FIG. 1, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a group III-V compound semiconductor substrate, or a group IV semiconductor substrate (for example, SiGe, Ge, SiGeSn, GeSn, GaAs, InGaAs, InP, AlGaAs, InAlAs, InAs, InGa, InAlGa, InSb, InGaSb, or GaN), or the like. Hereinafter, the bulk Si substrate will be described by way of example, for convenience of description.

In this example, for a device to be formed on the substrate 1001, the performance of the device can be improved by selecting a semiconductor material used therein (for example, a non-silicon material). In order to improve the quality of other semiconductor material layers which are to be grown, a buffer layer 1003 may be formed on the substrate 1001 by, for example, epitaxy. For example, the buffer layer 1003 may comprise $Si_{1-b}Ge_b$ (for example, b is between about 0.1 and 1) and has a thickness of, for example, about 200 nm to several micrometers. The buffer layer 1003 may be relaxed at least at the top thereof, so that the other semiconductor material layers may be subsequently grown on the buffer layer 1003 with a high quality.

A well region 1003w may be formed on the top of the buffer layer. If a p-type device is to be formed, the well region 1003w may be an n-type well; or if an n-type device is to be formed, the well region 1003w may be a p-type well. The well region 1003w may be formed by, for example, implanting a corresponding conductivity type (p-type or n-type) of dopants into the buffer layer 1003, with a doping concentration of about $1E17-2E18$ $cm^{-3}$. There are various ways to configure such a well region in the art, and details thereof will be omitted here.

A first source/drain layer 1005, a first leakage suppression layer 1007, a channel layer 1009, a second leakage suppression layer 1011, and a second source/drain layer 1013 may be formed in sequence on the buffer layer 1003 by, for example, epitaxy. All of these layers are semiconductor material layers.

The channel layer 1009 may comprise a semiconductor material capable of increasing an ON current and/or reducing an OFF current. For example, for a p-type device, the semiconductor material may be a material capable of improving mobility of carriers. Here, the so-called "improving" is generally relative to the conventional Si material (without being strained or stressed). For example, the channel layer 1009 may comprise a group IV semiconductor material, such as Ge or $Si_{1-y}Ge_y$ (for example, y is between about 0.1 and 1). The Ge-based material may enhance the mobility of electrons or holes with respect to the Si material, and thus is suitable for both the n-type device and the p-type device. A thickness of the channel layer 1009, for example, about 10-100 nm, may determine a gate length. The channel layer 1009 may be in-situ doped while being grown to adjust a threshold voltage ($V_t$) of the device. For example, for an n-type device, p-type doping may be performed on the channel layer 1009 (using, for example, B or In), or for a p-type device, n-type doping may be performed on the channel layer 1009 (using, for example, P or As), with a doping concentration of about 1E17-2E18 $cm^{-3}$. Certainly, the channel layer 1009 may be not intentionally doped.

The first source/drain layer 1005 and the second source/drain layer 1013 may comprise a semiconductor material different from that of the channel layer. Here, the term "different" not only means that compositions are different, but also means that the compositions are the same but contents of the compositions are different. This difference is primarily for the purpose of providing etching selectivity in the following processes. For example, the first source/drain layer 1005 may comprise $Si_{1-x}Ge_x$ (for example, x is between 0 and 1, but x is different from y; and the greater is the difference between x and y, the more obvious is the resultant etching selectivity). The second source/drain layer 1013 may comprise $Si_{1-z}Ge_z$ (for example, z is between 0 and 1, but z is different from y; and the greater is the difference between z and y, the more obvious is the resultant etching selectivity). The first source/drain layer 1005 and the second source/drain layer 1013 may have substantially the same materials, that is, x may be approximately equal to or equal to z. The first source/drain layer 1005 and the second source/drain layer 1013 each may have a thickness of about 20-50 nm. The first source/drain layer 1005 and the second source/drain layer 1013 may be in-situ doped while being grown. For example, for an n-type device, n-type doping may be performed on the first source/drain layer 1005 and the second source/drain layer 1013 (using, for example, As or P), or for a p-type device, p-type doping may be performed on the first source/drain layer 1005 and the second source/drain layer 1013 (using, for example, B or $BF_2$), with a doping concentration of about 1E17-1E20 $cm^{-3}$.

The leakage suppression layers 1007 and 1011 each may comprise a semiconductor material different from that of the channel layer and the source/drain layers. Likewise, this difference is primarily for the purpose of providing etching selectivity in the following processes. For example, the leakage suppression layer 1007 may comprise $Si_{1-LR1}Ge_{LR1}$ (for example, LR1 is between 0 and 1, but LR1 is different from x, y, and z; and the greater is the difference between LR1 and x, y, and z, the more obvious is the resultant etching selectivity). The leakage suppression layer 1011 may comprise $Si_{1-LR2}Ge_{LR2}$ (for example, LR2 is between 0 and 1, but LR2 is different from x, y, and z; and the greater is the difference between LR2 and x, y, and z, the more obvious is the resultant etching selectivity). The leakage suppression layers 1007 and 1011 may have substantially the same materials, that is, LR1 may be approximately equal to or equal to LR2. The leakage suppression layers 1007 and 1011 may have a thickness of about 1-10 nm.

Here, the leakage suppression layers 1007 and 1011 are provided to suppress leakage. To this end, the leakage suppression layers 1007 and 1011 each may have a band gap greater than that of at least one of overlying or underlying layers contiguous thereto. For example, the leakage suppression layer 1007 may have a band gap greater than that of at least one of the first source/drain layer 1005 and the channel layer 1009. To this end, LR1 may be greater than x, greater than y, or greater than both x and y. Likewise, the leakage suppression layer 1011 may have a band gap greater than that of at least one of the channel layer 1009 and the second source/drain layer 1013. To this end, LR2 may be greater than y, greater than z, or greater than both y and z.

In addition, the leakage suppression layers 1007 and 1011 may be in-situ doped while being grown. For example, for an n-type device, n-type doping may be performed on the leakage suppression layers 1007 and 1011 (using, for example, As or P), or for a p-type device, p-type doping may be performed on the leakage suppression layers 1007 and 1011 (using, for example, B or $BF_2$), with a doping concentration of about 1E18-1E21 $cm^{-3}$.

Certainly, the leakage suppression layers 1007 and 1011 may be omitted. In this case, the first source/drain layer, the channel layer, and the second source/drain layer may be stacked in sequence and contiguous to each other.

Figure 2A:
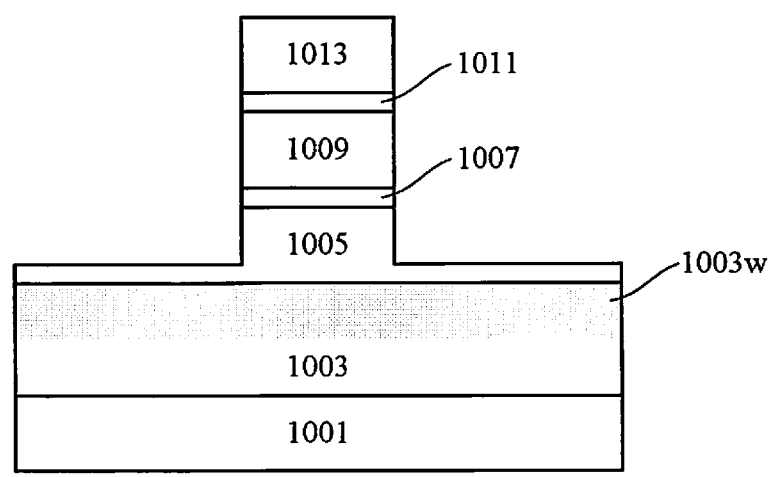
Figure 2B:
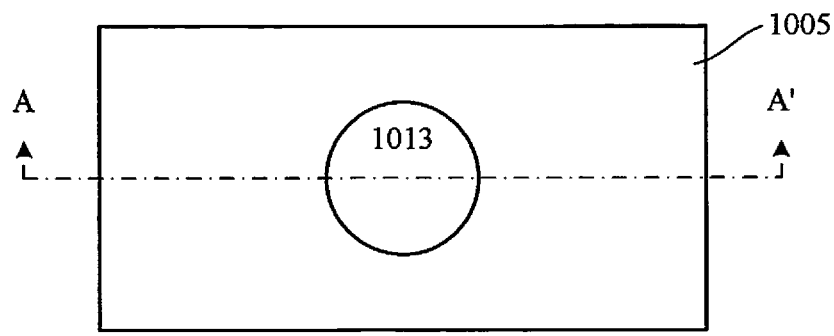

Next, an active region may be defined for the device. For example, this can be done as follows. Specifically, as shown in FIGS. 2(a) and 2(b) (FIG. 2(a) is a sectional view, and FIG. 2(b) is a top view with line AA' indicating the location where the sectional view is taken), photoresist (not shown) may be formed on the stack of the first source/drain layer 1005, the first leakage suppression layer 1007, the channel layer 1009, the second leakage suppression layer 1011 and the second source/drain layer 1013 as shown in FIG. 1, and then patterned into a desired shape (a substantially circular shape in this example, or other shapes such as a rectangle) by photolithography (exposure and development). The second source/drain layer 1013, the second leakage suppression layer 1011, the channel layer 1009, the first leakage suppression layer 1007 and the first source/drain layer 1005 may be selectively etched by, for example, Reactive Ion Etching (RIE), in sequence with the patterned photoresist as a mask. The etching may go into the first source/drain layer 1005, but stop before reaching a bottom surface of the first source/drain layer 1005. Then, the respective semiconductor layers are in a pillar or wall shape (a cylindrical shape in this case) after being etched. The RIE may be performed in, for example, a direction substantially perpendicular to a surface of the substrate, and thus the pillar shape extends in the direction substantially perpendicular to the substrate surface. After that, the photoresist may be removed.

Figure 3:
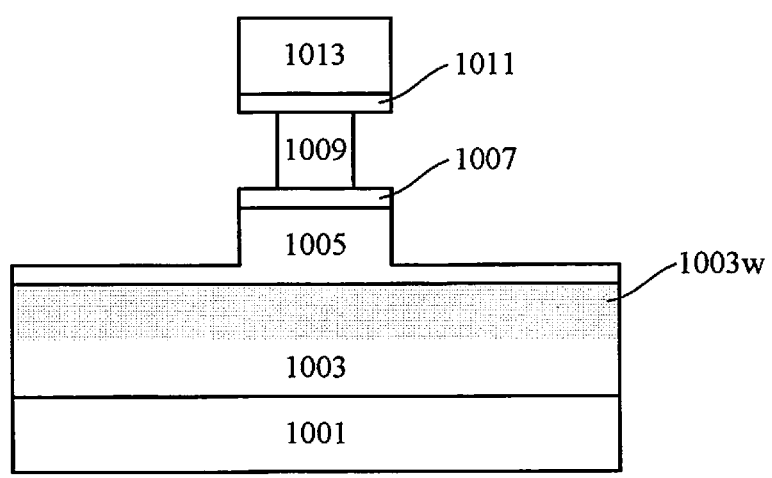

Then, as shown in FIG. 3, a periphery of the channel layer 1009 may be recessed (in this example, in a lateral direction substantially parallel to the substrate surface) with respect to peripheries of the first source/drain layer 1005 and the second source/drain layer 1013 (as well as the first leakage suppression layer 1007 and the second leakage suppression layer 1011). For example, this can be done by selectively etching the channel layer 1009 further with respect to the first source/drain layer 1005 and the second source/drain layer 1013 (as well as the first leakage suppression layer 1007 and the second leakage suppression layer 1011). As described above, since y is different from x and z (as well as LR1, LR2 and b), such selective etching is possible. The selective etching may comprise Atomic Layer Etching (ALE) or digital etching to achieve accurately controllable etching.

Thus, the active region for the semiconductor device is defined, i.e., the first source/drain layer 1005, the channel layer 1009 and the second source/drain layer 1013 (as well as the first leakage suppression layer 1007 and the second leakage suppression layer 1011), after being etched. In this example, the active region is in a substantially pillar shape. In the active region, the first source/drain layer 1005 may have its periphery substantially aligned with that of the second source/drain layer 1013, while the periphery of the channel layer 1009 is relatively recessed.

Certainly, the active region is not limited to the specific shape illustrated, but can be formed in different shapes according to design layout. For example, the active region may be in an ellipse, a square, a rectangle, or the like in the top view.

Figure 4:
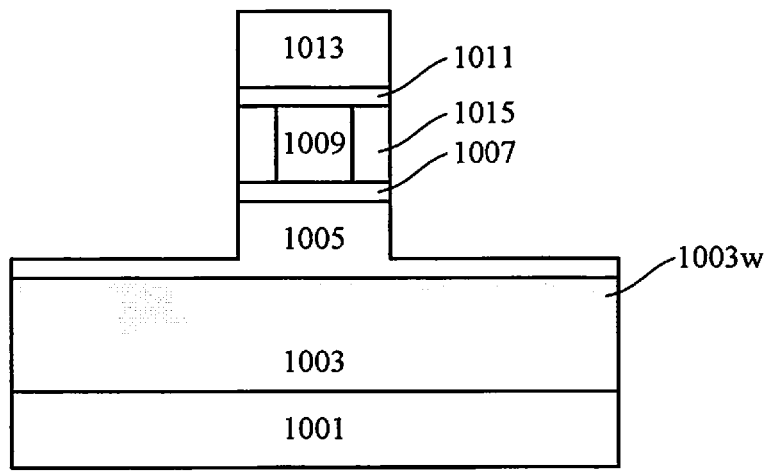

In the recess which is formed by the channel layer 1009 with respect to the peripheries of the first source/drain layer 1005 and the second source/drain layer 1013, a gate stack will be formed later. To prevent the following processes from impacting the channel layer 1009 or leaving some unwanted material(s) in this recess which will impede the formation of the gate stack, a material layer may be filled in the recess to occupy the space for the gate stack (and thus, this material layer may be referred to as a "sacrificial gate"). For example, this can be done by depositing nitride on the structure shown in FIG. 3 and then etching the deposited nitride back by, for example, RIE. The RIE may be performed in a direction substantially perpendicular to the substrate surface, so that the nitride can be left only within the recess, resulting in the sacrificial gate 1015, as shown in FIG. 4. In this case, the sacrificial gate 1015 may substantially fill the recess up.

Figure 5:
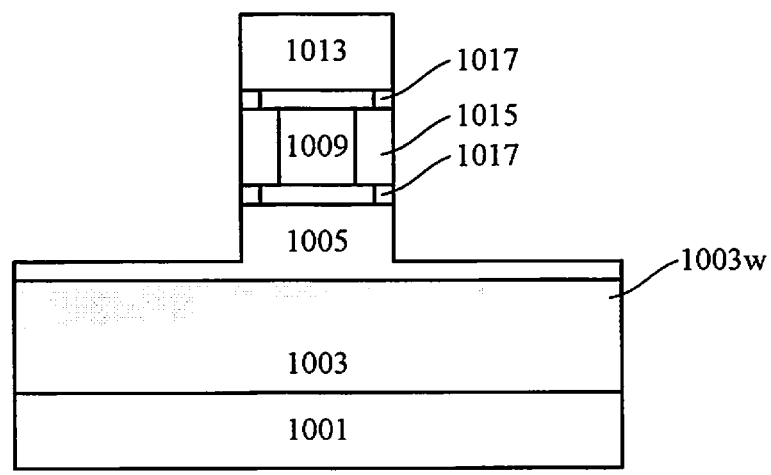

Similarly, the leakage suppression layers 1007 and 1011 may be selectively etched by, for example, ALE, for accurately controllable etching, so as to be relatively recessed. The recess is filled with a dielectric spacer 1017, as shown in FIG. 5. The dielectric spacer 1017 may comprise low K dielectric, for example, oxide, nitride, or oxynitride. Here, the dielectric spacer 1017 may comprise a material, for example, oxynitride, which is different from that of the sacrificial gate 1015, so as not to be removed along with removal of the sacrificial gate.

If desired, particularly in a case where the leakage suppression layers 1007 and 1011 are not (in-situ) doped, annealing treatment may be performed to drive dopants from the source/drain layers 1005 and 1013 into the leakage suppression layers 1007 and 1011 to reduce resistance between the source/drain regions and the channel, thereby improving device performances. This annealing treatment may also activate the dopants in the source/drain layers 1005 and 1013.

In addition, in order to reduce contact resistance, a silicidation process may be performed on a surface of the source/drain layers. For example, a layer of metal such as Co, Ti, or NiPt may be deposited on the structure shown in FIG. 5, and then annealing may be performed at a temperature of about 200-600° C., so that the metal reacts with SiGe to produce a layer of silicide (for example, SiNiPt in a case of NiPt). After that, the unreacted metal may be removed.

Figure 6:
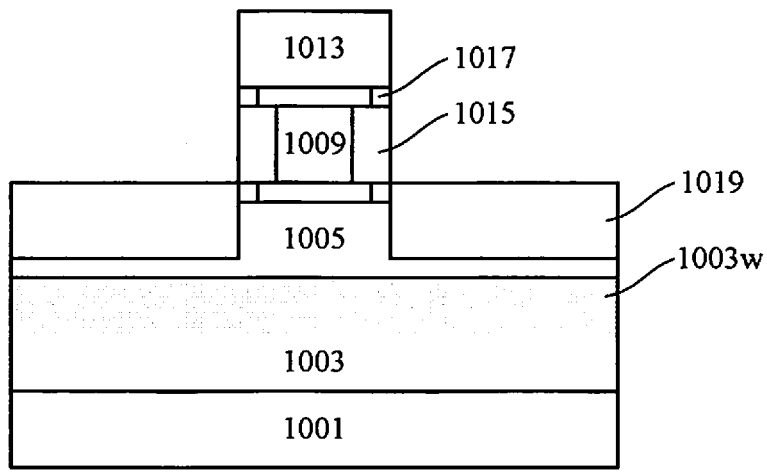

An isolation layer may be formed around the active region to achieve electrical isolation. For example, as shown in FIG. 6, oxide may be deposited on the structure shown in FIG. 5 and then etched back to form an isolation layer 1019. Before the back etching, the deposited oxide may be planarized by, for example, Chemical Mechanical Polishing (CMP) or sputtering. Here, the isolation layer 1019 may have its top surface close to an interface between the channel layer 1009 and the first leakage suppression layer 1007.

In forming the isolation layer, the sacrificial gate 1015 may remain to prevent the material of the isolation layer from going to the recess in which the gate stack is to be accommodated. After that, the sacrificial gate 1015 may be removed to release the space in the recess. For example, the sacrificial gate 1015 (nitride) may be selectively etched with respect to the isolation layer 1019 (oxide), the dielectric spacer 1017 (oxynitride), the second source/drain layer 1013 ($Si_{1-z}Ge_z$) and the channel layer 1009 ($Si_{1-y}Ge_y$).

Figure 7:
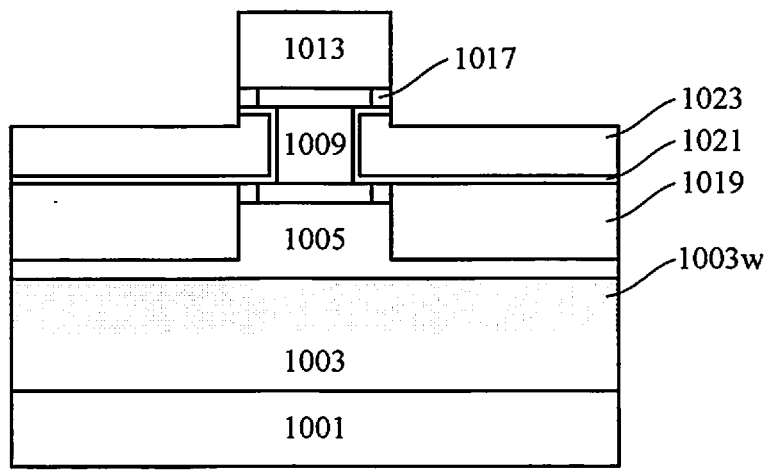

Then, as shown in FIG. 7, the gate stack may be formed in the recess. Specifically, a gate dielectric layer 1021 and a gate conductor layer 1023 may be deposited in sequence on the structure shown in FIG. 6 (with the sacrifice gate 1015 removed), and the deposited gate conductor layer 1023 (and optionally the gate dielectric layer 1021) may be etched back so that a portion thereof outside the recess has its top surface at a level not higher than and preferably lower than the top surface of the channel layer 1009. For example, the gate dielectric layer 1021 may comprise high K gate dielectric such as $HfO_2$, and the gate conductor layer 1023 may comprise a metal gate conductor. Further, a work function adjustment layer may be further formed between the gate dielectric layer 1021 and the gate conductor layer 1023. An interfacial layer of, for example, oxide, may be formed before the formation of the gate dielectric layer 1021.

In this way, the gate stack may be embedded into the recess, and thus overlap with an entire height of the channel layer 1009.

In addition, the isolation layer 1019 may have its top surface at a level not lower than the interface between the channel layer 1009 and the first leakage suppression layer 1007, and preferably between the top surface and the bottom surface of the channel layer 1009, to reduce or avoid possible overlap between the gate stack and the source/drain, thereby reducing parasitic capacitance between the gate and the source/drain.

Figure 8A:
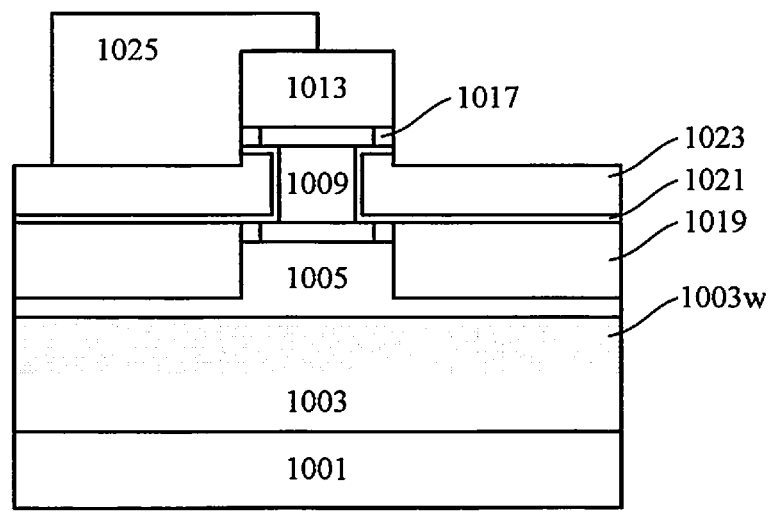
Figure 8B:
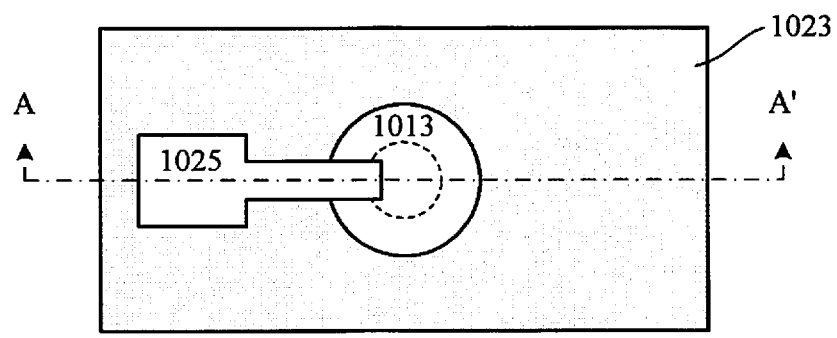

Next, the gate stack may be adjusted in shape to facilitate manufacturing of contacts later. For example, as shown in FIGS. 8(*a*) and 8(*b*) (FIG. 8(*a*) is a sectional view, and FIG. 8(*b*) is a top view with line AA' indicating the location where the sectional view is taken), photoresist 1025 may be formed on the structure shown in FIG. 7. The photoresist 1025 may be patterned, for example, by photolithography to cover some area (on the left side in this example as shown in the figure) of the portion of the gate stack outside the recess while exposing the remaining area (the right side in this example as shown in the figure) of the portion of the gate stack outside the recess.

Then, as shown in FIGS. 9(*a*) and 9(*b*) (FIG. 9(*a*) is a sectional view, and FIG. 9(*b*) is a top view with line AA' indicating the location where the sectional view is taken), the gate conductor layer 1023 may be selectively etched by, for example, RIE, with the photoresist 1025 as a mask. Thus, the gate conductor layer 1023 has its portion masked by the photoresist 1025 left in addition to a portion thereof inside the recess. As shown, the gate conductor layer 1023 extends in a strip shape from the recess beyond the periphery of the active region, and may have an end portion with an increased area (for serving as, for example, a pad). The electrical connection to the gate stack may then be achieved by this portion.

According to another embodiment, the gate dielectric layer 1021 may be further selectively etched by, for example, RIE (not shown). After that, the photoresist 1021 may be removed.

Figure 9A:
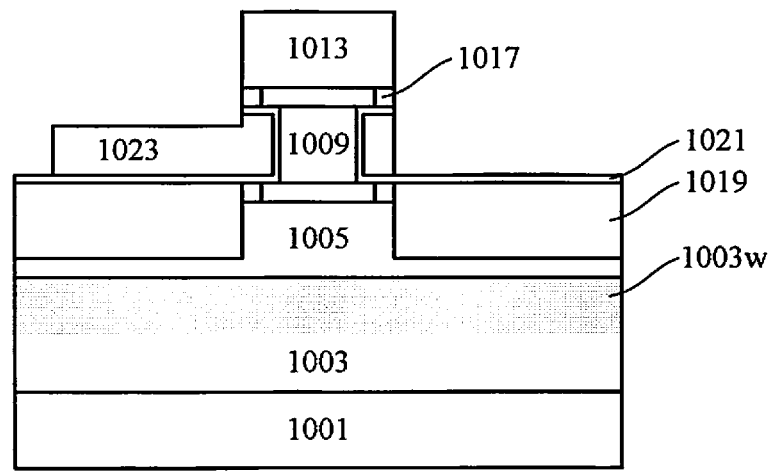
Figure 9B:
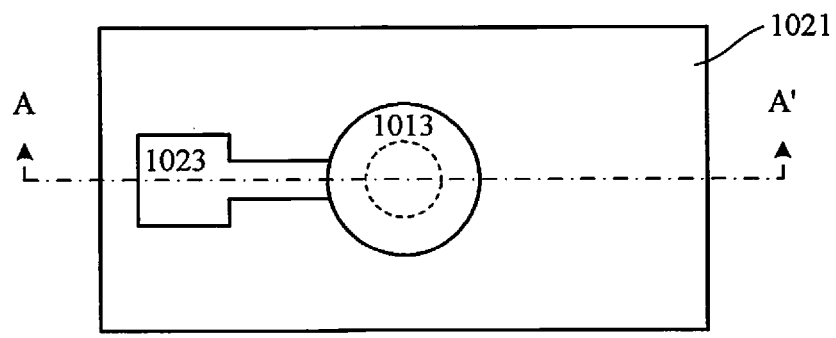
Figure 10A:
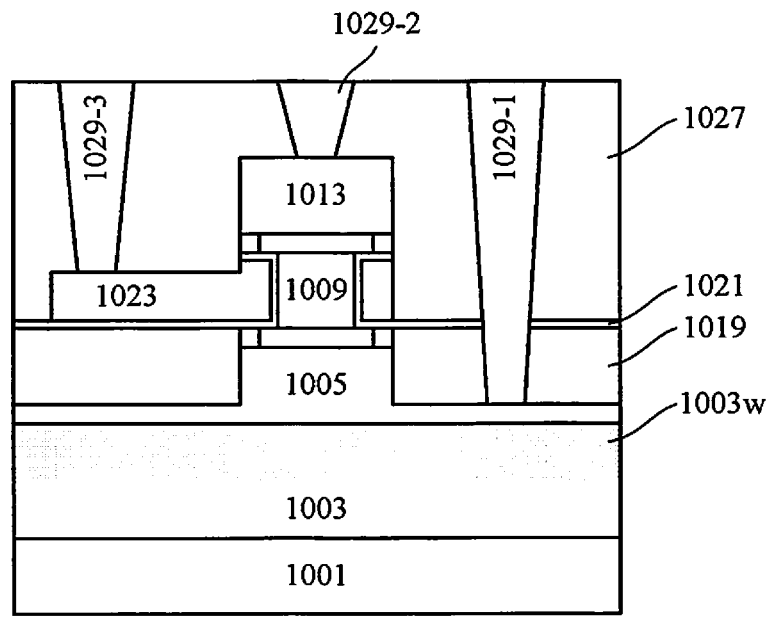
Figure 10B:
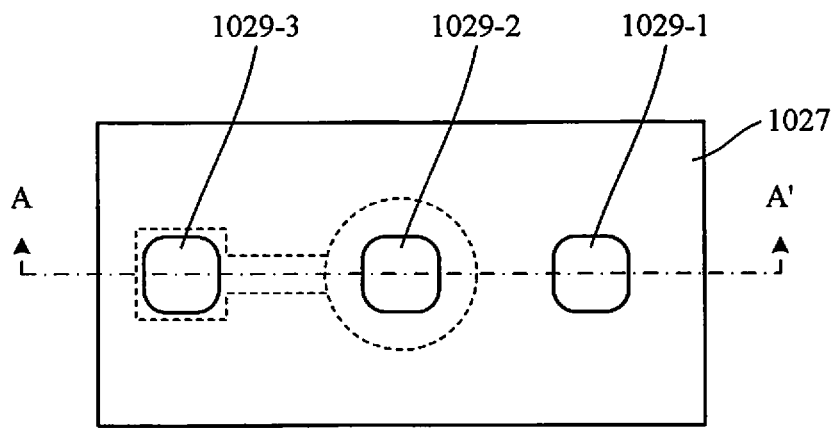

Then, as shown in FIGS. 10(a) and 10(b) (FIG. 10(a) is a sectional view, and FIG. 10(b) is a top view with line AA' indicating the location where the sectional view is taken), an interlayer dielectric layer 1027 may be formed on the structure shown in FIGS. 9(a) and 9(b). For example, oxide may be deposited and then planarized by, for example, CMP, to form the interlayer dielectric layer 1027. A contact 1029-1 to the first source/drain layer 1005, a contact 1029-2 to the second source/drain layer 1013, and a contact 1029-3 to the gate conductor layer 1023 may be formed in the interlayer dielectric layer 1027. These contacts may be formed by etching the interlayer dielectric layer 1027 and the isolation layer 1019 to form holes therein and filling a conductive material such as metal in the holes.

According to another embodiment, the dielectric spacer 1017 may be removed before the interlayer dielectric layer 1027 is deposited, to form a gas spacer. For example, before the interlayer dielectric layer 1027 is deposited, the gate dielectric layer 1021, the isolation layer 1019, and the dielectric spacer 1017 may be removed in sequence, and then the interlayer dielectric layer 1027 may be deposited while leaving unfilled gaps on opposite sides of the leakage suppression layers 1007 and 1011 to form the gas spacer.

Since the gate conductor layer 1023 extends beyond the periphery of the active region, the contact 1029-3 to the gate conductor layer 1023 may be easily formed. In addition, since the lower portion of the first source/drain layer 1005 extends beyond the active region above the first source/drain layer 1005 and has at least some portion thereof not overlapped by the gate conductor layer, the contact 1029-1 to the first source/drain layer 1005 may be easily formed.

As shown in FIGS. 10(a) and 10(b), the semiconductor device according to the present embodiment comprises the first source/drain layer 1005, the channel layer 1009, and the second source/drain layer 1013 stacked in the vertical direction. The source/drain regions are formed in the first source/drain layer 1005 and the second source/drain layer 1013. The channel layer 1009 is laterally recessed, and the gate stack (1021/1023) is formed around the periphery of the channel layer 1009 and embedded in the recess. The channel layer 1009 may comprise the material capable of increasing the ON current and/or reducing the OFF current. Further, the leakage suppression layers 1007 and 1011 are formed between the first source/drain layer 1005 and the channel layer 1009 and between the channel layer 1009 and the second source/drain layer 1013, respectively.

It is to be noted that the recess of the channel layer with respect to the source/drain layers may not exist in the final device. For example, the source/drain layers may become thinner due to the silicidation process described above.

In the embodiments described above, the channel layer uses a group IV Ge-based material, which is particularly advantageous for p-type devices. For example, stacks such as GeSn/Ge/GeSn, Ge/SiGe/Ge, SiGeSn/SiGeSn/SiGeSn (contents of Ge and Sn in the source/drain layers may be greater than those in the channel layer), or GeSn/SiGeSn/GeSn may be formed. In this case, there may be enhanced strain in the channel layer.

According to another embodiment of the present disclosure, the channel layer may use a group III-V compound semiconductor material, which can also increase the ON current and/or reduce the OFF current. The channel layer of the group III-V compound semiconductor material is particularly suitable for n-type devices. The group III-V compound semiconductor material of the channel layer may comprise one of GaAs, InGaAs, InP, AlGaAs, InAlAs, InAs, InGa, InAlGa, GaN, InSb, or InGaSb, or a combination thereof. The semiconductor material of the channel layer may also comprise SiGe or Ge.

The first source/drain layer 1005 and the second source/drain layer 1013 may also comprise a group III-V compound semiconductor material such as GaAs, InGaAs, InP, AlGaAs, InAlAs, InAs, InGa, InAlGa, GaN, InSb, InGaSb. A ratio of group III element(s) to group V element(s) in the source/drain layers may be different from that in the channel layer. Alternatively, the first source/drain layer 1005 and the second source/drain layer 1013 may comprise a group IV semiconductor material such as SiGe, Ge, SiGeSn, GeSn, InSb, or InGaSb.

For example, the channel layer 1009 may comprise InGaAs with a thickness of about 20-100 nm. The first source/drain layer 1005 and the second source/drain layer 1013 may comprise a semiconductor material different from that of the channel layer, for example, a different III-V compound semiconductor material such as InP, with a thickness of about 20 -40 nm. They may be doped as described above.

Likewise, the leakage suppression layers 1007 and 1011 may also be formed. The leakage suppression layer 1007 may comprise a group IV semiconductor material such as $Si_{1-LR1}Ge_{LR1}$ described above (for example, LR1 is between 0 and 1) or a group III-V compound semiconductor material, and the leakage suppression layer 1011 may comprise a group IV semiconductor material such as $Si_{1-LR2}Ge_{LR2}$ described above (for example, LR2 is between 0 and 1) or a group III-V compound semiconductor material. Values of LR1 and LR2 or compositions and/or contents of the compositions of the group III-V compound semiconductor material may be selected, so that the leakage suppression layers 1007 and 1011 each have a band gap greater than that of at least one of overlying or underlying layers contiguous thereto. For example, the leakage suppression layer 1007 may comprise one of SiGe, Ge, SiGeSn, GeSn, GaAs, InGaAs, InP, AlGaAs, InAlAs, InAs, InGa, InAlGa, GaN, InSb, or InGaSb, or a combination thereof.

To accommodate such a semiconductor stack, the buffer layer 1003 may comprise $Si_{1-b}Ge_b$ (for example, b is between about 0.5 and 1).

Figure 11:
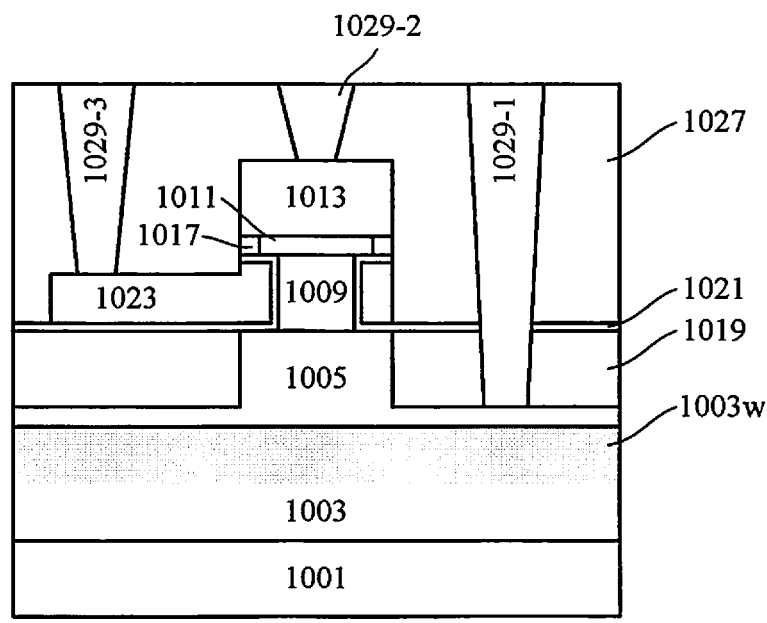
FIG. 11 is a schematic cross-sectional view showing a semiconductor device according to another embodiment of the present disclosure.

In the embodiments described above, the same conductivity type of doping (for example, p-type doping or n-type doping) may be performed on the first source/drain layer 1005 and the second source/drain layer 1013, so that a conventional FET (pFET or nFET) may be formed. According to another embodiment of the present disclosure, different conductivity types of doping (of which, for example, one is n-type doping, and the other is p-type doping) may be performed on the first source/drain layer 1005 and the second source/drain layer 1013 to form a tunneling FET. The channel layer 1009 may be not intentionally doped (i.e., the channel layer 1009 is an intrinsic layer) or may be lightly doped. This doping may be achieved by in-situ doping the respective semiconductor layers during the growth thereof In the case of the tunneling FET, it is possible to dispose only one leakage suppression layer at a tunneling junction, instead of the two leakage suppression layers. FIG. 11 illustrates such a device. As shown in FIG. 11, the leakage suppression layer 1011 is disposed between the channel layer 1009 and the second source/drain layer 1013, and the leakage suppression layer 1007 is omitted. Certainly, if tunneling occurs between the first source/drain layer and the channel layer 1009, the leakage suppression layer 1007 may be disposed between the first source/drain layer and the channel layer 1009, and the leakage suppression layer 1011 may be omitted.

In the embodiments described above, a leakage suppression layer having a band gap greater than that of an overlying or underlying layer thereof is used. According to another embodiment of the present disclosure, particularly in the case of the tunneling FET, an ON current enhancement layer may be used instead of the leakage suppression layers. In this case, the ON current enhancement layer may have a band gap less than that of at least one of overlying or underlying layers contiguous thereto. To this end, LR1 may be less than x, less than y, or less than both x and y, and LR2 may be less than y, less than z, or less than both y and z.

The semiconductor device according to the embodiments of the present disclosure is applicable to various electronic devices. For example, an Integrated Circuit (IC) may be formed by integrating a plurality of such semiconductor devices and also other devices (for example, transistors in other forms or the like), from which an electronic device may be made. Therefore, the present disclosure further provides an electronic device comprising the above semiconductor device. The electronic device may also comprise components such as a display operatively coupled to the IC and a wireless transceiver operatively coupled to the IC, or the like. Such an electronic device may comprise, for example, a smart phone, a computer, a tablet Personal Computer (PC), an artificial intelligence device, a wearable device, a mobile power supply, or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

The embodiments of the present disclosure are described above. However, those embodiments are provided only for illustrative purpose, rather than limiting the scope of the present disclosure. The scope of the present disclosure is defined by the attached claims as well as equivalents thereof. Those skilled in the art can make various alternations and modifications without departing from the scope of the present disclosure, which all fall within the scope of the present disclosure.

We claim:

1. A semiconductor device, comprising:
   a substrate;
   a first source/drain layer, a channel layer and a second source/drain layer stacked on the substrate in sequence, wherein the channel layer comprises a semiconductor material causing an increased ON current and/or a reduced OFF current as compared to Si;
   a first leakage suppression layer and/or a first ON current enhancement layer disposed between the first source/drain layer and the channel layer and/or a second leakage suppression layer and/or a second ON current enhancement layer disposed between the channel layer and the second source/drain layer; and
   a gate stack surrounding a periphery of the channel layer, wherein the gate stack is self-aligned to the channel layer, and an upper surface of the gate stack is aligned with a lower surface of the second leakage suppression layer and/or the second ON current enhancement layer, and/or a lower surface of the gate stack is aligned with an upper surface of the first leakage suppression layer and/or the first ON current enhancement layer,
   wherein the second source/drain layer extends outward relative to the second leakage suppression layer and/or the second ON current enhancement layer, and/or the first source/drain layer extends outward relative to the first leakage suppression layer and/or the first ON current enhancement layer,
   wherein the second leakage suppression layer and/or the second ON current enhancement layer extend or extends outward relative to the channel layer, and/or the first leakage suppression layer and/or the first ON current enhancement layer extend or extends outward relative to the channel layer, and
   wherein there is a crystal interface between adjacent layers among the channel layer, either of the first leakage suppression layer or second leakage suppression layer and/or either of the first ON current enhancement layer or second ON current enhancement layer.

2. The semiconductor device of claim 1, wherein
   for a p-type device, the channel layer comprises a group IV material system or a group III-V compound semiconductor material; or
   for an n-type device, the channel layer comprises a group IV material system or a group III-V compound semiconductor material.

3. The semiconductor device of claim 1, wherein
   for a p-type device, the first source/drain layer and the second source/drain layer each comprise SiGe, Ge, SiGeSn, InSb, InGaSb or GeSn, and the channel layer comprises SiGe, Ge, SiGeSn, InSb, InGaSb or GeSn; or
   for an n-type device, the first source/drain layer and the second source/drain layer each comprise SiGe, Ge, SiGeSn, GaAs, InGaAs, InP, AlGaAs, InAlAs, InAs, InGa, InAlGa or GaN, and the channel layer comprises SiGe, Ge, GaAs, InGaAs, InP, AlGaAs, InAlAs, InAs, InGa, InAlGa, InSb, InGaSb or GaN,
   wherein the first source/drain layer and the second source/drain layer are doped differently and have a different ratio of III-V elements from the channel layer.

4. The semiconductor device of claim 1, wherein the first source/drain layer and the second source/drain layer have the same conductivity type of doping, so that the semiconductor device constitutes a vertical field effect transistor.

5. The semiconductor device of claim 1, wherein the first source/drain layer and the second source/drain layer have different conductivity types of doping, so that the semiconductor device constitutes a vertical tunneling field effect transistor.

6. The semiconductor device of claim 5, wherein one of the first source/drain layer and the second source/drain layer constitutes a tunneling junction together with the channel layer.

7. The semiconductor device of claim 1, further comprising a dielectric spacer disposed at opposite ends of either of the first or second leakage suppression layers and/or either of the first or second ON current enhancement layers.

8. The semiconductor device of claim 7, wherein the dielectric spacer comprises low K dielectric or gas, and wherein the low K dielectric is a dielectric material that has a dielectric constant lower than a high K dielectric material.

9. The semiconductor device of claim 8, wherein the low K dielectric comprises oxide, nitride, or oxynitride.

10. The semiconductor device of claim 1, wherein either of the first or second leakage suppression layers and/or either of the first or second ON current enhancement layers comprise or comprises one of SiGe, Ge, SiGeSn, GeSn, GaN, InGaAs, InP, AlGaAs, InAlAs, InAs, InGa, InAlGa, GaN, InSb, or InGaSb, or a combination thereof.

11. The semiconductor device of claim 1, wherein the first source/drain layer is a semiconductor layer epitaxially grown on the substrate, the channel layer is a semiconductor layer epitaxially grown on the first source/drain layer, and the second source/drain layers is a semiconductor layer epitaxially grown on the channel layer.

12. The semiconductor device of claim 1, wherein the channel layer has its periphery recessed inwards with respect to that of the first source/drain layer and the second source/drain layer, and the gate stack is embedded into a recess of the periphery of the channel layer with respect to that of the first source/drain layer and the second source/drain layer to be self-aligned to the channel layer.

13. The semiconductor device of claim 1, wherein there is a crystal interface between at least one pair of adjacent layers among the first source/drain layer, either of the first leakage suppression layer or second leakage suppression layer and/or either of the first ON current enhancement layer or second ON current enhancement layer, and the second source/drain layer; and/or
there is a doping concentration interface between at least one pair of adjacent layers among the first source/drain layer, the channel layer, the second source/drain layer, either of the first leakage suppression layer or second leakage suppression layer and/or either of the first ON current enhancement layer or second ON current enhancement layer.

14. The semiconductor device of claim 1, wherein the channel layer comprises a monocrystalline semiconductor material, and the monocrystalline semiconductor material has a same crystal structure as that of the first source/drain layer and the second source/drain layer.

15. The semiconductor device of claim 1, wherein the first and second leakage suppression layers have a band gap greater than that of at least one of overlying or underlying layers contiguous thereto, and/or the first and second ON current enhancement layers have a band gap less than that of at least one of overlying or underlying layers contiguous thereto.

16. An electronic device comprising an Integrated Circuit (IC) comprising the semiconductor device of claim 1.

17. The electronic device of claim 16, further comprising a display operatively coupled to the IC and a wireless transceiver operatively coupled to the IC.

18. The electronic device of claim 16, wherein the electronic device comprises a smart phone, a computer, a tablet computer, an artificial intelligence device, a wearable device, or a mobile power supply.

19. A method of manufacturing a semiconductor device, comprising:
epitaxially growing a first source/drain layer on a substrate;
epitaxially growing a channel layer on the first source/drain layer, wherein the channel layer comprises a semiconductor material causing an increased ON current and/or a reduced OFF current as compared to Si;
epitaxially growing a second source/drain layer on the channel layer;
defining an active region for the semiconductor device in the first source/drain layer, the channel layer, and the second source/drain layer; and
forming a gate stack around a periphery of the channel layer, wherein the gate stack is self-aligned to the channel layer, the method further comprising:
epitaxially growing a first leakage suppression layer and/or a first ON current enhancement layer between the first source/drain layer and the channel layer and/or a second leakage suppression layer and/or a second ON current enhancement layer between the channel layer and the second source/drain layer, wherein an upper surface of the gate stack is aligned with a lower surface of the second leakage suppression layer and/or the second ON current enhancement layer, and/or a lower surface of the gate stack is aligned with an upper surface of the first leakage suppression layer and/or the first ON current enhancement layer, the method further comprising:
selectively etching the first leakage suppression layer and/or the first ON current enhancement layer and/or the second leakage suppression layer and/or the second ON current enhancement layer, so that the second source/drain layer extends outward relative to the second leakage suppression layer and/or the second ON current enhancement layer, and/or the first source/drain layer extends outward relative to the first leakage suppression layer and/or the first ON current enhancement layer,
wherein the second leakage suppression layer and/or the second ON current enhancement layer extend or extends outward relative to the channel layer, and/or the first leakage suppression layer and/or the first ON current enhancement layer extend or extends outward relative to the channel layer, and
wherein there is a crystal interface between adjacent layers among the channel layer, either of the first leakage suppression layer or second leakage suppression layer and/or either of the first ON current enhancement layer or second ON current enhancement layer.

20. The method of claim 19, wherein the defining of the active region further comprises:
recessing a periphery of the channel layer inwards with respect to that of the first source/drain layer and the second source/drain layer.

21. The method of claim 20, wherein the defining of the active region comprises:
selectively etching the second source/drain layer, the channel layer, and the first source/drain layer in sequence; and
further selectively etching the channel layer, so that the channel layer is recessed with respect to the periphery of the first source/drain layer and the second source/drain layer.

22. The method of claim 21, wherein the defined active region has a pillar shape, and the etched first source/drain layer has a pillar-shaped upper portion and a lower portion extending beyond a periphery of the pillar-shaped upper portion.

23. The method of claim 19, further comprising:
forming a dielectric spacer in a recess of either of the first or second leakage suppression layers and/or either of the first or second ON current enhancement layers relative to the first and second source/drain layers.

24. The method of claim 21, wherein the selective etching of the channel layer is atomic layer etching or digital etching.

25. The method of claim 23, wherein the forming of the dielectric spacer comprises forming a low K dielectric spacer and/or a gas spacer, and wherein the low K dielectric is a dielectric material that has a dielectric constant lower than a high K dielectric material.

26. The method of claim 20, further comprising:
doping the first source/drain layer and the second source/drain layer to form source/drain regions in the first source/drain layer and the second source/drain layer.

27. The method of claim 26, wherein the doping of the first source/drain layer and the second source/drain layer comprises doping the first source/drain layer and the second source/drain layer into the same conductivity or different conductivities.

28. The method of claim 26, wherein the doping comprises:
performing the doping in-situ during the growing.

29. The method of claim 20, further comprising:
forming a sacrificial gate in a recess of the periphery of the channel layer with respect to that of the first source/drain layer and the second source/drain layer; and
forming an isolation layer around the active region on the substrate, wherein the isolation layer has its top surface close to an interface between the channel layer and an underlying layer contiguous thereto.

30. The method of claim 29, wherein the forming of the gate stack comprises:
forming a gate dielectric layer and a gate conductor layer on the isolation layer in sequence; and
etching back the gate conductor layer, so that a portion of the gate conductor layer outside the recess has its top surface at a level lower than that of a top surface of the channel layer.

* * * * *